United States Patent [19]
Uramoto

[11] Patent Number: 5,910,904
[45] Date of Patent: Jun. 8, 1999

[54] DIGITAL FILTER APPARATUS

[75] Inventor: Yoichi Uramoto, Kanagawa, Japan

[73] Assignee: Sony Corporation, Tokyo, Japan

[21] Appl. No.: 08/824,272

[22] Filed: Mar. 26, 1997

[30] Foreign Application Priority Data

Mar. 27, 1996 [JP] Japan .................................. 8-072857

[51] Int. Cl.$^6$ .................................................. G06F 17/10
[52] U.S. Cl. ...................................... 364/724.011; 381/98
[58] Field of Search ....................... 364/724.011, 724.11, 364/724.2; 381/98

[56] References Cited

U.S. PATENT DOCUMENTS

| | | | |
|---|---|---|---|
| 5,313,494 | 5/1994 | Park et al. ................................ | 375/295 |
| 5,617,480 | 4/1997 | Ballard et al. ............................ | 381/98 |
| 5,654,909 | 8/1997 | Sun ........................................... | 381/98 |

Primary Examiner—Albert DeCady
Assistant Examiner—Shelly A Chase
Attorney, Agent, or Firm—Jay H. Maioli

[57] ABSTRACT

A digital filter apparatus including a pair of infinite impulse response (IIR) digital filters connected in parallel for selectively controlling an output level of an input signal fed to the filter apparatus. One IIR digital filter is a low-pass filter and the other IIR digital filter is an all-pass filter. A pair of level control circuits are respectively connected to outputs of the pair of IIR digital filters, and an adder combines outputs of the level control circuits to form the filter apparatus output. Phase characteristics of the pair of IIR digital filters with respect to a frequency are made substantially coincident with each other and control levels of the level control circuits are adjusted so that the output level of the filter apparatus in a predetermined frequency range is controlled.

6 Claims, 5 Drawing Sheets

DIGITAL FILTER APPARATUS

BACKGROUND OF THE INVENTION

1. Field of the Invention

The present invention relates to a digital filter apparatus suitable for use in an equalizer unit and a tone control unit for an audio signal and using an infinite impulse response digital filter (hereinafter sometimes referred to as an "IIR filter").

2. Description of the Related Art

Since a CD player to be mounted on a vehicle has a problem in that medium and bass tones cannot easily be heard because of road noise and/or engine noise, a filter apparatus, such as a tone controller or a loudness controller, is employed to make variable the output level of the audio signal in the medium and bass tones (about 200 Hz or lower) in order to emphasize the output level in the medium and bass tones to an appropriate level.

Since the inclination of the damping property of a conventional filter apparatus of the foregoing type is considerably moderate such as 6 dB/oct, the damped side tone adjacent to the medium and bass tones is adversely affected by the filter characteristics.

SUMMARY OF THE INVENTION

In view of the foregoing, an object of the present invention is to provide a digital filter apparatus using a infinite impulse response digital filters, capable of arbitrarily controlling an output level in a predetermined frequency range without influence of phase rotation of the infinite impulse response digital filters and having steep inclination, i.e. in the frequency response, of the damping property.

According to one aspect of the present invention, there is provided a digital filter apparatus comprising a pair of different type infinite impulse response digital filters connected in parallel to an input terminal of the digital filter apparatus; level control means respectively disposed in output portions of the pair of infinite impulse response digital filters; and an adder for adding outputs from the pair of infinite impulse response digital filters to each other to supply a result of the addition to an output terminal of the digital filter apparatus, wherein phase characteristics of the pair of infinite impulse response digital filters with respect to frequencies are made substantially coincident with each other and control levels of the pair of level control means are adjusted so that an output level in a predetermined frequency range is controlled.

According to the above aspect of the present invention, the phase characteristics of the pair of the infinite impulse response digital filters with respect to the frequency are caused to approximate each other. Thus, any adverse influence of the phase rotation of the infinite impulse response digital filters does not act on the frequency characteristic of the digital filter apparatus. By adjusting the control levels of the pair of level control means, the output level in a predetermined frequency range (a pass range or damping range) can be controlled.

Other objects, features and advantages of the invention will be evident from the following detailed description of the preferred embodiments described in conjunction with the attached drawings.

DESCRIPTION OF THE PREFERRED EMBODIMENTS

Figure 1:
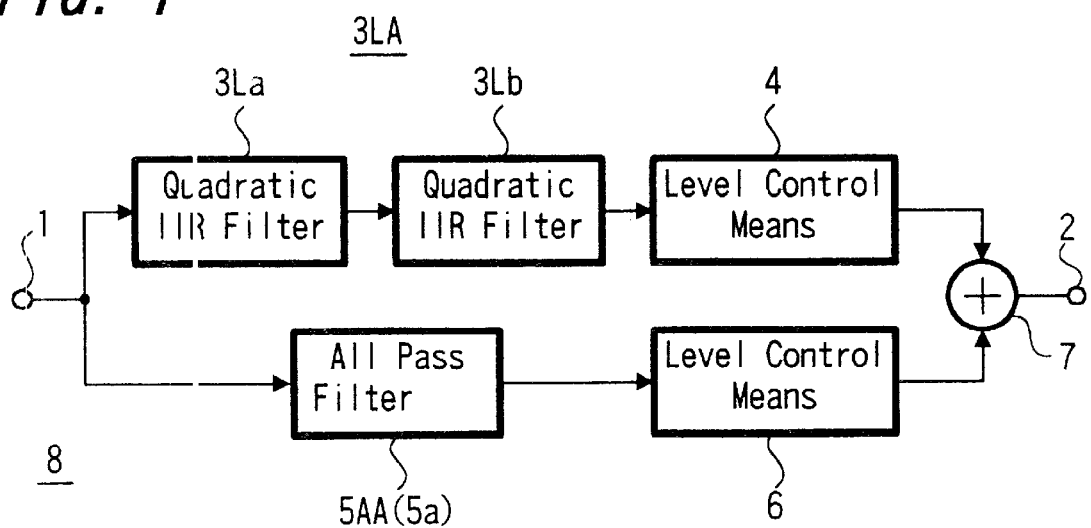
FIG. 1 is a block diagram showing an embodiment of the present invention.

Referring to FIG. 1, an embodiment of the present invention will now be described. This embodiment has a structure such that an equalizer (a tone controller) is applied to an audio reproducing apparatus, such as a CD player or the like, and more particularly to an audio reproducing apparatus to be mounted on a vehicle and arranged to be capable of controlling levels of audio signals in the medium and bass tones which are not higher than about 200 Hz.

Reference numeral 8 represents the overall body of the equalizer which has an input terminal 1 for receiving an audio signal, and 2 represents an output terminal 2 for an equalized digital audio signal. A digital audio signal to be supplied to the input terminal 1 is a signal reproduced from, for example, a CD (Compact Disk) player in the form of a digital audio signal.

In the embodiment shown in FIG. 1 there is provided a Butterworth low pass filter comprising a quaternary IIR filter composed of a cascade circuit having Butterworth low pass filters 3La and 3Lb each comprising a quadratic IIR filter. A level control means (which is formed of a digital amplifier or a digital attenuator) 4 is connected to the next stage of the low pass filter 3LA, that is, the next stage of the low pass filter 3Lb. An all pass filter 5AA comprising a quadratic IIR filter 5a is also provided. A level control means (which is formed of a digital amplifier or a digital attenuator) 6 is connected to the next stage of the all pass filter 5AA.

A digital audio signal supplied from the input terminal 1 is supplied to each of the low pass filter 3LA comprising the quaternary IIR filter and the all pass filter 5AA comprising the quadratic IIR filter. Outputs from the level control means 4 and 6 are supplied to an adder (a digital adder)(a full adder) 7 so as to be added to each other. An output denoting the result of the addition therefrom is delivered to the output terminal 2.

The low pass filter 3LA comprising the quaternary IIR filter and the all pass filter 5AA comprising the quadratic IIR filter have the same phase rotational angles which are 360° at maximum. In this case, the phase characteristics of the low pass filter 3LA and the all pass filter 5AA with respect to the frequency of the input digital audio signal are made to substantially coincide with each other. The coincidence of the phase characteristics will be described later.

Figure 4A:
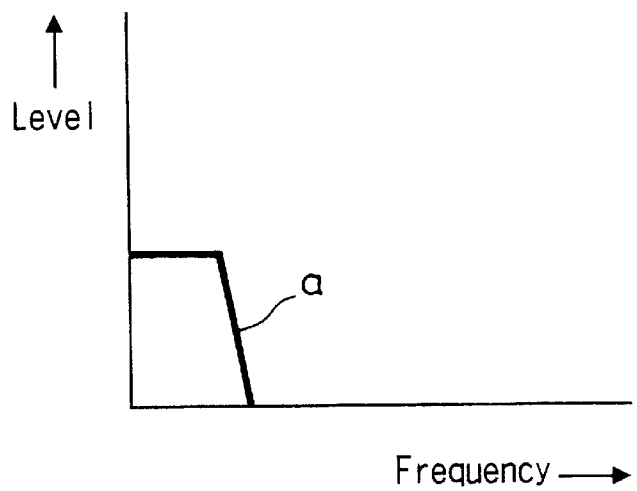
FIGS. 4A to 4C are frequency characteristic graphs for use to explain operation of the embodiment of the present invention.
Figure 4B:
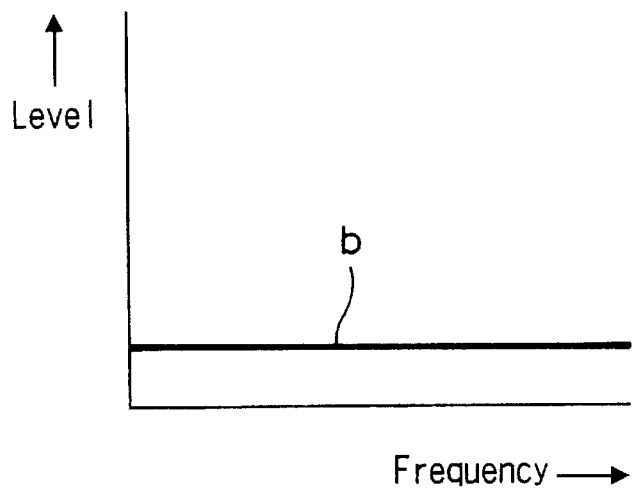
Figure 4C:
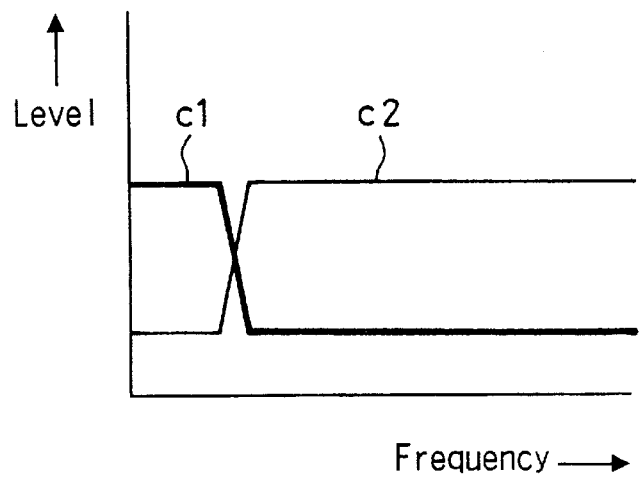

Referring to FIGS. 4A to 4C, the operation of the digital filter apparatus according to the embodiment shown in FIG. 1 will now be described. In the graph of FIG. 4A a curve a indicates the frequency characteristic of the low pass filter 3LA comprising the quaternary IIR filter, that is, the characteristic of the level of the output digital audio signal with respect to the frequencies of the input digital audio signal, the characteristic of the levels being a low pass characteristic. The cutoff frequency thereof is set to be a level near 200 Hz. Since the low pass filter 3LA comprises the quaternary IIR filter, inclination of the damping characteristic thereof becomes a steep inclination of 24 dB/oct.

A curve b in the graph of FIG. 4B indicates the frequency characteristic of the all pass filter 5AA comprising the quadratic IIR filter, that is, the characteristic of the level of the output digital audio signal with respect to the frequencies of the input digital audio signal, the characteristic of the level being an all pass characteristic.

An assumption is made such that the level of the digital audio signal to be supplied to the input terminal 1 is $K_0$ times (where $0<K_0<1$) the level of the original digital audio signal, that is, an assumption is made such that $K_0=\frac{1}{4}$ in this case, for example. A ratio $K_1$ of the output level of the level control means 4 with respect to the input level of the same can be varied within a range from $-1$ to 3. Moreover, a ratio $K_2$ of the output level of the level control means 6 with respect to the input level of the same is fixed to 1. Thus, the level of the digital audio signal output to the output terminal 2 is changed in a range from 0 to 1. A fact that the ratio of the output level with respect to the input level is made to be a negative number means phase inversion of the digital audio signal.

As a result, the frequency characteristic of the overall equalizer 8 shows a low pass characteristic (a low range emphasizing characteristic) as indicated by a curve c1 shown in the graph of FIG. 4C when $3 \geq K_1 > 0$. When $K_1=0$, a low range inhibition characteristic {high pass characteristic (high range emphasizing characteristic)} is attained as a curve by symbol c2 shown in the graph of FIG. 4C. If the frequency characteristic of the overall equalizer 8 is made such that when $0 > K_1 \geq -1$, an all pass characteristic is attained. Therefore, by varying the input and output level ratio $K_1$ of the level control means 4 within the foregoing range from $-1$ to 3, the level of the medium and bass tones of the output digital audio signal can be strengthened or weakened.

The general relationship among the foregoing factors $K_0$, $K_1$ and $K_2$ will now be described. The level of the digital audio signal supplied to the input terminal 1 is retained to be the same as the level of the original digital audio signal, $K_0$ is made to be an arbitrary value satisfying $0<K_0<1$, the input and output level ratio $K_1$ of the level control means 4 is varied within a range from $-K_0$ to $(1-K_0)$, and the input and output level ratio $K_2$ of the level control means 6 is fixed to $K_0$. By the way, it may be possible that the input and output level ratio $K_1$ of the level control means 4 is fixed to $K_0$ and the input and output level ratio $K_2$ of the level control means 6 is varied in a range from $-K_0$ to $(1-K_0)$.

As described above, the low pass filter 3LA comprising the quaternary IIR filter and the all pass filter 5AA comprising the quadratic IIR filter have the same phase rotational angles which are 360° at maximum. The operation for making substantially coincide the phase characteristics of the low pass filter 3LA and the all pass filter 5AA with respect to the input digital audio signal will now be described. Although the phase characteristics of the low pass filter 3LA and the all pass filter 5AA with respect to the frequency of the input digital audio signal cannot be made to perfectly be the same, no practical problem arises.

Then, $Q_a$ is obtained which is a quality factor of the all pass filter 5AA realized when the phase characteristics of the Butterworth low pass filter 3LA comprising the quaternary IIR filter and the all pass filter 5AA comprising the quadratic IIR filter with respect to the frequency of the input digital audio signal substantially coincide with each other. Prior to obtaining $Q_a$, the fact that the foregoing phase characteristics do not perfectly coincide with each other will now be described. Assuming that $Q_a$, which is the quality factor of the all pass filter 5AA, is taken as a variable and the phase characteristics of the low pass filter 3LA and the all pass filter 5AA with respect to the frequency perfectly coincide with each other. The phase characteristic curves of the low pass filter 3LA and the all pass filter 5AA with respect to angular frequency $\omega \div$ are expressed by the following Equations 1 and 2. By the way, $Q_1$ and $Q_2$ are quality factors of the low pass filters 3L$a$ and 3L$b$ each comprising the quadratic IIR filter forming the low pass filter 3LA.

$$\arg T_{LPF}(\omega, Q_1, Q_2) = \qquad (1)$$
$$-\tan^{-1}\left\{\frac{(1/2Q_1)\sin(\omega)}{\cos(\omega)-\cos(\omega_0)}\right\} - \tan^{-1}\left\{\frac{(1/2Q_2)\sin(\omega)}{\cos(\omega)-\cos(\omega_0)}\right\}$$

wherein $\omega_0$ and $\omega$ are expressed as follows when $f_s$ is a sampling frequency, $f_c$ is a cutoff frequency and freq is an arbitrary frequency (satisfying freq $\leq f_s/2$):

$$\omega_0 = 2\pi \frac{fc}{fs} \qquad \omega = 2\pi \frac{freq}{fs} \qquad (2)$$

$$\arg T_{APF}(\omega, Q_a) = -2\tan^{-1}\left\{\tan\left(\frac{\omega_0}{2Q_a}\right)\frac{\sin(\omega)}{\cos(\omega)-\cos(\omega_0)}\right\}$$

When Equations 1 and 2 are assumed to be the same, the following Equation 3 is established. If $Q_1=Q_2$ is not satisfied, $Q_a$ which is the quality factor of the all pass filter 5AA does not exist.

$$\frac{1}{2}Q_1 = \tan\left(\frac{\omega_0}{2Q_a}\right) = \frac{1}{2}Q_2 \qquad (3)$$

$$Q_2 = \frac{2}{\omega_0 \tan^{-1}\left(\frac{Q_1}{2}\right)} = \frac{2}{\omega_0 \tan^{-1}\left(\frac{Q_2}{2}\right)}$$

Equations 1 and 2 are differentiated with angular frequency $\omega$, and then an assumption is made that the inclinations of the phase characteristic curves are the same to obtain $Q_a$ which is the quality factor of the all pass filter 5AA. The following Equation 4 indicates a result. Note that symbols $\alpha$ and $\beta$ are constants.

$$\frac{d}{dw}\arg T_{LPF}(\omega, Q_1, Q_2) = \frac{d}{dw}\arg T_{APF}(\omega, Q_a) \qquad (4)$$

$$Q_a = \frac{2}{\omega_0} \frac{1}{\tan^{-1}\left(\frac{\frac{1}{2}}{A}\right)}$$

-continued $$A = \frac{\frac{\alpha}{2Q_1}\{\beta\cos(\omega)-1\}}{\{\cos(\omega)-\beta\}^2 + \frac{1}{4Q_1^2}\alpha^2\sin(\omega)} + \frac{\frac{\alpha}{2Q_2}\{\beta\cos(\omega)-1\}}{\{\cos(\omega)-\beta\}^2 + \frac{1}{4Q_2^2}\alpha^2\sin(\omega)}$$

where $\alpha = \sin(\omega_0), \beta = \cos(\omega_0)$

When Equations 3 and 4 are compared, a fact can be understood that the characteristic curve of the low pass filter 3LA and that of the all pass filter 5AA do not theoretically coincide with each other.

Accordingly, $Q_a$ which is the quality factor of the all pass filter 5AA when the characteristic curve of the low pass filter 3LA and that of the all pass filter 5AA substantially coincide with each other is obtained. At first, the difference arg diff (ω) between the two characteristic curves is obtained.

$$\arg diff (\omega, Q_1, Q_2, Q_a) = \arg T_{LPF}(\omega, Q_1, Q_2) - \arg T_{APF}(\omega, Q_2) \quad (5)$$

Then, the difference arg diff ($Q_a$) is definitely integrated with the audio angular frequency range, thus resulting in an equation expressed in Equation 6 being obtained.

$$\arg DIFF(Q_1, Q_2, Q_a) = \int_{\omega=2\pi\frac{20\,Hz}{fs}}^{\omega=2\pi\frac{20\,kHz}{fs}} \arg diff(\omega, Q_1, Q_2, Q_a) d(\omega) \quad (6)$$

It can be considered from Equation 6 that when arg DIFF ($Q_a$) has the smallest value, the two phase characteristics approximate maximally. In this case, $Q_1$ and $Q_2$ are constants. The digital filter apparatus can be obtained by making $Q_a$ which is the quality factor of the all pass filter 5AA at this time as the parameter and by obtaining the coefficient of a coefficient multiplier.

Figure 2:
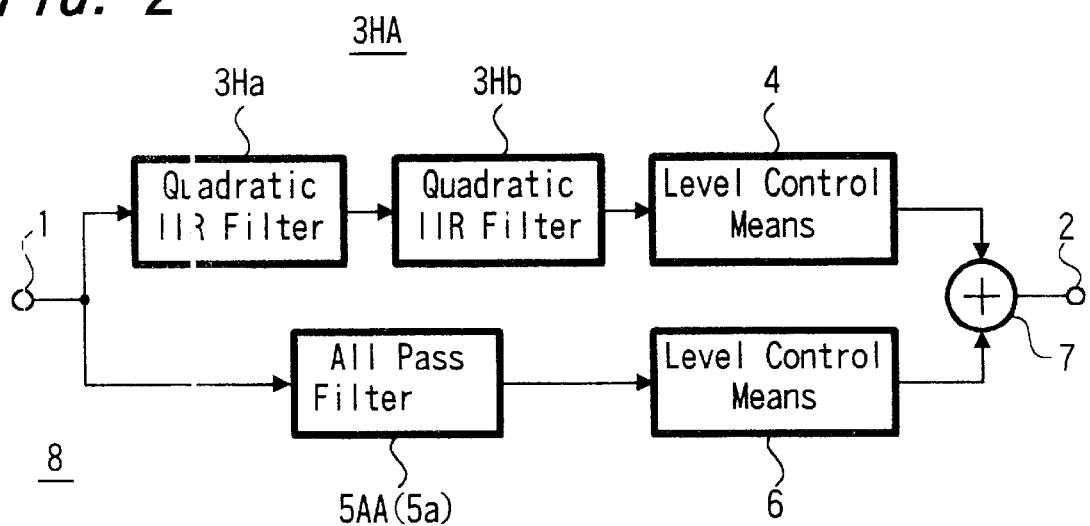
FIG. 2 is a block diagram showing another embodiment of the present invention.

Referring to FIG. 2, another embodiment of the present invention will now be described. Also this embodiment has a structure such that an equalizer (a tone controller) 8 is applied to an audio reproducing apparatus, such as a CD player or the like, and more particularly to an audio reproducing apparatus to be mounted on a vehicle and arranged to be capable of controlling levels of audio signals in the medium and bass tones which are not higher than about 200 Hz. Referring to FIG. 2, elements corresponding to those shown in FIG. 1 are given the same reference numerals and the same elements are omitted from description. In this embodiment, a Butterworth high pass filter 3HA comprising a quaternary IIR filter composed of a cascade circuit having Butterworth high pass filters 3H$a$ and 3H$b$ each comprising a quadratic IIR filter is employed in place of the Butterworth low pass filter 3LA comprising the quaternary IIR filter composed of a cascade circuit having Butterworth low pass filters 3L$a$ and 3L$b$ each comprising a quadratic IIR filter according to the embodiment shown in FIG. 1. The other structures are similar to those shown in FIG. 1.

Also in this embodiment, the high pass filter 3HA comprising the quaternary IIR filter and the all pass filter 5AA comprising the quadratic IIR filter have the same phase rotational angles which are 360° at maximum. In this case, the phase characteristics of the high pass filter 3HA and the all pass filter 5AA with respect to the frequency of the supplied digital audio signal are made to substantially coincide with each other.

Figure 5A:
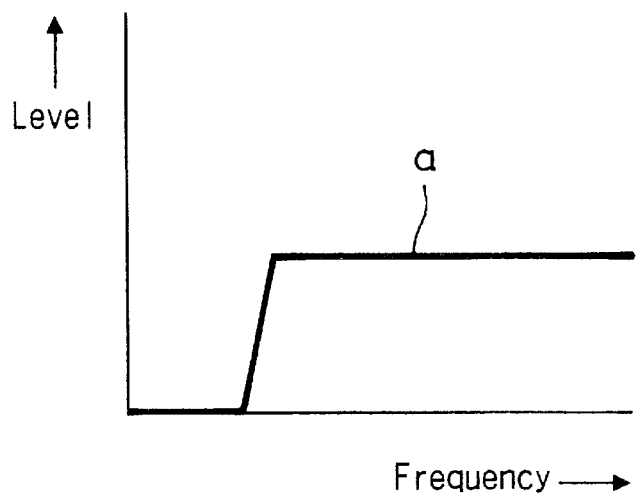
FIGS. 5A to 5C are frequency characteristic graphs for use to explain operation of the embodiment of the present invention.
Figure 5B:
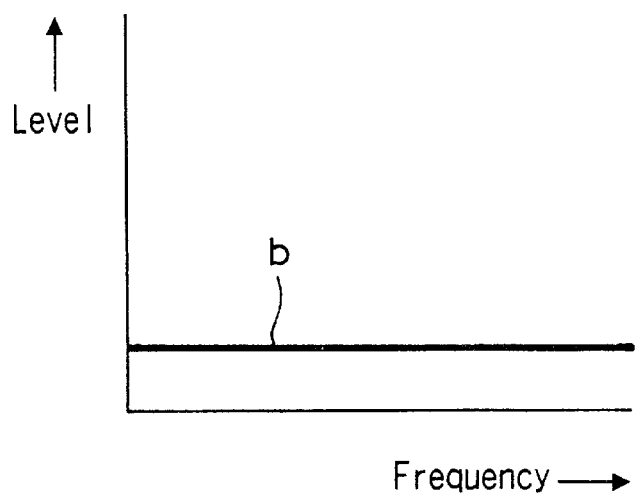
Figure 5C:
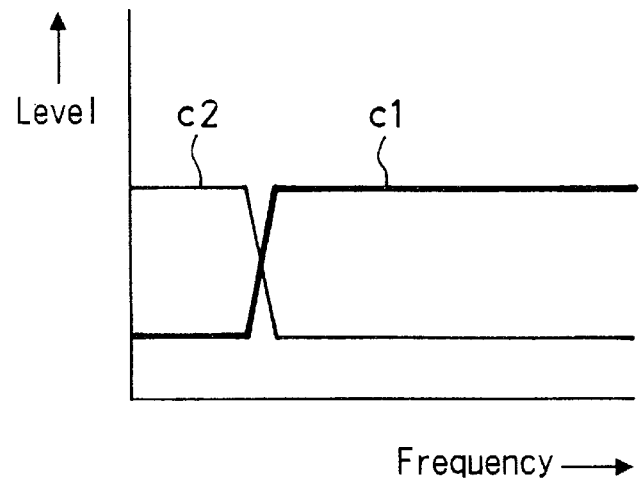

Referring to FIGS. 5A–5C, the operation of the digital filter apparatus according to this embodiment shown in FIG. 2 will now be described. A curve a in the graph of FIG. 5A indicates the frequency characteristic of the high pass filter 3HA comprising the quaternary IIR filter, that is, the characteristic of the levels of the output digital audio signal with respect to the frequencies of the input digital audio signal, the characteristic of the levels being a high pass characteristic (low range inhibition characteristic). The cutoff frequency thereof is set to be a level near 200 Hz. Since the high pass filter 3HA comprises the quaternary IIR filter, the inclination of the damping characteristics thereof becomes a steep inclination of 24 dB/oct.

A curve b in the graph shown in FIG. 5B indicates the frequency characteristic of the all pass filter 5AA comprising the quadratic IIR filter, that is, the characteristic of the level of the output digital audio signal with respect to the frequencies of the input digital audio signal, the characteristic of the level being an all pass characteristic.

An assumption is made such that the level of the digital audio signal to be supplied to the input terminal 1 is $K_0$ times (where $0<K_0<1$) the level of the original digital audio signal, that is, an assumption is made such that $K_0=\frac{1}{4}$ in this case. The ratio $K_1$ of the output level of the level control means 4 with respect to the input level of the same can be varied within a range from −1 to 3. Moreover, the ratio $K_2$ of the output level of the level control means 6 with respect to the input level of the same is fixed to 1. Thus, the level of the digital audio signal output to the output terminal 2 is changed in a range from 0 to 1. A fact that the ratio of the output level with respect to the input level is made to be a negative number means phase inversion of the digital audio signal.

As a result, the frequency characteristic of the overall equalizer 8 shows a high pass characteristic (a high range emphasizing characteristic) (a low range inhibition characteristic) as indicated by a curve c1 shown in FIG. 5C when $0<K_1 \leq 3$. When $-1 \leq K_1 < 0$, a high range inhibition characteristic {a low pass characteristic (a low range emphasizing characteristic)} is attained as indicated by a curve c2 in the graph shown in FIG. 5C. If the frequency characteristic of the overall equalizer 8 is made such that $K_1=0$, an all pass characteristic is attained. Therefore, by varying the input and output level ratio $K_1$ of the level control means 4 within the foregoing range from −¼ to 3, the level of the medium and bass tones of the output digital audio signal can be weakened or strengthened.

The general relationship among the foregoing factors $K_0$, $K_1$ and $K_2$ will now be described. The level of the digital audio signal supplied to the input terminal 1 is retained to be the same as the level of the original digital audio signal, $K_0$ is made to be an arbitrary value satisfying $0<K_0<1$, the input and output level ratio $K_1$ of the level control means 4 is varied within a range from $-K_0$ to $(1-K_0)$, and the input and output level ratio $K_2$ of the level control means 6 is fixed to $K_0$. By the way, it may be possible that the input and output level ratio $K_1$ of the level control means 4 is fixed to $K_0$ and the input and output level ratio $K_2$ of the level control means 6 is varied in a range from $-K_0$ to $(1-K_0)$.

Figure 3:
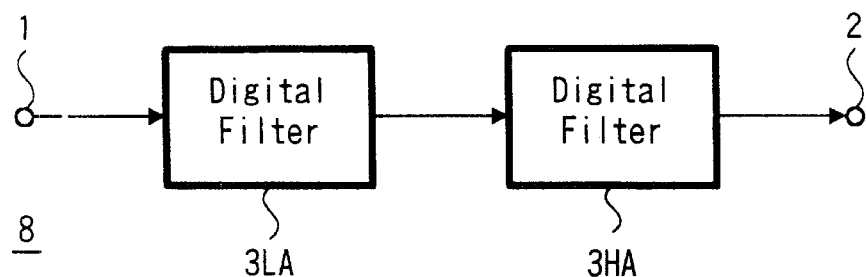
FIG. 3 is a block diagram showing further embodiment of the present invention.

FIG. 3 is a diagram showing a further embodiment of the present invention. In this embodiment, an equalizer (a tone controller) is formed by cascade-connecting the equalizers 8 shown in FIG. 1 and 2 between the input terminal 1 and the output terminal 2 so as to independently control the output level of the bass and treble tones.

Figure 6:
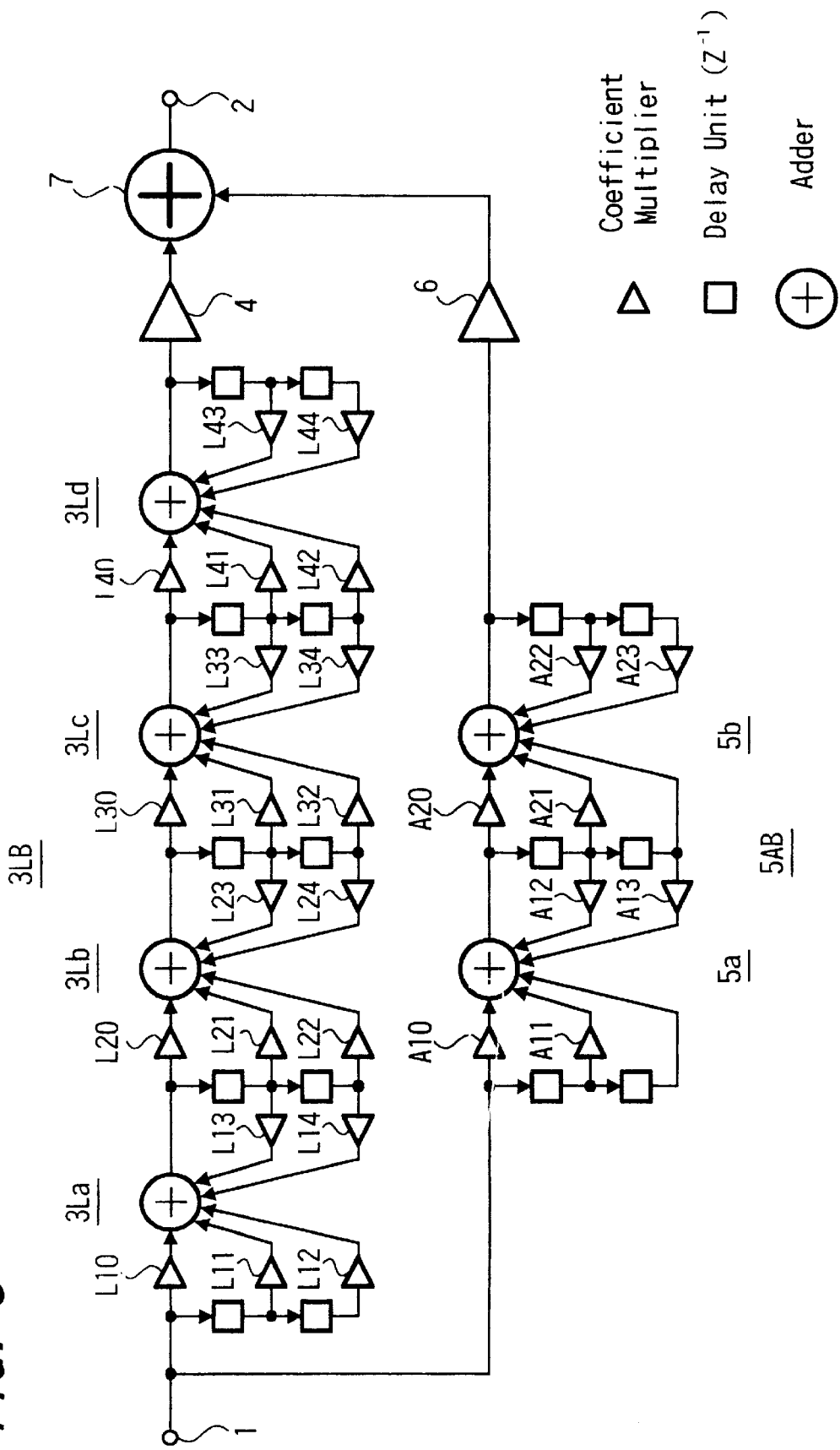
FIG. 6 is a block diagram showing a still another embodiment of the present invention.

Referring to FIG. 6, a yet another embodiment of the present invention will now be described. In FIG. 6, elements similar to those shown in FIG. 1 are given the same reference numerals. This embodiment has a structure such that an equalizer (a tone controller) is applied to an audio reproducing apparatus, such as a CD player or the like, and more particularly to an audio reproducing apparatus to be mounted on a vehicle and arranged to be capable of controlling levels of audio signals in the medium and bass tones not higher than about 200 Hz.

As shown in FIG. 6 there is provided an input terminal 1 for receiving an audio signal and an output terminal 2 for an equalized digital audio signal. The digital audio signal to be supplied to the input terminal 1 is, in this embodiment, a signal reproduced from a CD (Compact Disk) player.

A Butterworth low pass filter 3LB comprising an octet IIR filter is provided which is composed of a cascade circuit having Butterworth low pass filters 3L$a$, 3L$b$, 3L$c$ and 3L$d$ each comprising a quadratic IIR filter. A level control means (which is formed of a digital amplifier or a digital attenuator) 4 is connected to the next stage of the low pass filter 3LB, that is, the next stage of the low pass filter 3L$d$. There is provided an all pass filter comprising a quaternary IIR filter 5$a$ and formed by a cascade circuit comprising all pass filters 5$a$ and 5$b$ each of which is composed of a quadratic IIR filter. A level control means (which is formed of a digital amplifier or a digital attenuator) 6 is connected to the next stage of the all pass filter 5AB.

A digital audio signal supplied from the input terminal 1 is supplied to each of the low pass filters 3LB comprising the octet IIR filter and the all pass filter 5AB comprising the quaternary IIR filter. Outputs from the level control means 4 and 6 are supplied to an adder (a digital adder)(a full adder) 7 so as to be added to each other. An output denoting the result of the addition therefrom is delivered to an output terminal 2.

The low pass filter 3LB comprising the octet IIR filter and the all pass filter 5AB comprising the quaternary IIR filter have the same phase rotational angles which are 720° at maximum. In this case, the phase characteristics of the low pass filter 3LB and the all pass filter 5AB with respect to the frequency of the input digital audio signal are made to substantially coincide with each other. Then, $Q_a$ is obtained which is a quality factor of the all pass filter 5AB realized when the characteristic curve of the low pass filter 3LB and that of the all pass filter 5AB substantially coincide with each other. Then, the difference arg diff ($\omega$) between the two characteristic curves is obtained. The difference arg diff ($\omega$) is definitely integrated with the audio angular frequency range, thus resulting in an equation similar to that expressed in Equation 6 being obtained. When arg DIFF ($Q_a$) in the equation is made to be the minimum value, two phase characteristic curves coincide maximally. Accordingly, the digital filter apparatus can be obtained by making $Q_a$ which is the quality factor of the all pass filter 5AB as the parameter and by obtaining the coefficient of the coefficient multiplier.

Coefficients of low pass filters 3L$a$ to 3L$d$ each comprising a quadratic IIR filter each of which is composed of a coefficient multiplier, a delay unit (its delay amount is $Z^{-1}$, that is, one clock period of a clock signal for a digital audio signal) and an adder and coefficients of all pass filters 5$a$ and 5$b$ each of which comprises a quadratic IIR filter each being composed the same elements as those of the quadratic IIR filter are as follows:

The coefficients of coefficient multipliers L10 to L14 of the low pass filter 3L$a$ are as follows: L10: 0.000197, L11: 0.000395, L12: 0.000197, L13: −1.944842 and L14: 0.945632.

The coefficients of the coefficient multipliers L20 to L24 of the low pass filter 3L$b$ are as follows: L20: 0.000198, L21: 0.000397, L22: 0.000198, L23: −1.952924, and L24: 0.953717.

The coefficients of the coefficient multipliers L30 to L34 of the low pass filter 3L$c$ are as follows: L30: 0.000200, L31: 0.000400, L32: 0.000200, L33: −1.968036, and L34: 0.968835.

The coefficients of the coefficient multipliers L40 to L44 of the low pass filter 3L$d$ are as follows: L40: 0.000202, L41: 0.000404, L42: 0.000202, L43: −1.988137, and L44: 0.988945.

The coefficients of the coefficient multipliers A10 to A13 of the all pass filter 5$a$ are as follows: A10: 0.949711, A11: −1.948920, A12: −1.948920, and A13: 0.949711.

The coefficients of the coefficient multipliers A20 to A23 of the all pass filter 5$b$ are as follows: A20: 0.979391, A21: −1.948588, A22: −1.978588, and A23: 0.979391.

Referring to FIG. 6, an assumption is made such that the level of the digital audio signal to be supplied to the input terminal 1 is $K_0$ times (where $0<K_0<1$) the level of the original digital audio signal, that is, an assumption is made such that $K_0=\frac{1}{4}$ in this case. The ratio $K_1$ of the output level of the level control means 4 with respect to the input level of the same can be varied within a range from −1 to 3. Moreover, the ratio $K_2$ of the output level of the level control means 6 with respect to the input level of the same is fixed to 1. Thus, the level of the digital audio signal output to the output terminal 2 is changed in a range from 0 to 1. A fact that the ratio of the output level with respect to the input level is made to be a negative number means phase inversion of the digital audio signal.

As a result, the frequency characteristic of the overall equalizer shows a low pass characteristic (a low range emphasizing characteristic) when $0<K_1 \leq 3$. When $-1 \leq K_1 < 0$, a low range inhibition characteristic {high pass characteristic (high range emphasizing characteristic)} is attained. If the frequency characteristic of the overall equalizer is made such that $K_1=0$ an all pass characteristic is attained. Therefore, by varying the input and output level ratio $K_1$ of the level control means 4 within the foregoing range from −1 to 3 as described above, the level of the medium and bass tones of the output digital audio signal can be strengthened or weakened.

The general relationship among the foregoing factors $K_0$, $K_1$ and $K_2$ will now be described.

The level of the digital audio signal supplied to the input terminal 1 is retained to be the same as the level of the original digital audio signal, $K_0$ is made to be an arbitrary value satisfying $0<K_0<1$, the input and output level ratio $K_1$ of the level control means 4 is varied within a range from $-K_0$ to $(1-K_0)$, and the input and output level ratio $K_2$ of the level control means 6 is fixed to $K_0$. By the way, it is possible that the input and output level ratio $K_1$ of the level control means 4 may be fixed to $K_0$ and the input and output level ratio $K_2$ of the level control means 6 may be varied in a range from $-K_0$ to $(1-K_0)$.

Note that the structure shown in FIG. 6 may be formed such that a Butterworth high pass filter comprising an octet IIR filter is substituted for the Butterworth low pass filter 3LB comprising the octet IIR filter.

In general, the embodiment of the present invention has a structure having a pair of different type IIR filters connected in parallel, to the input terminal of the digital filter apparatus; the level control means respectively disposed at the in output sides of the pair of IIR filters; and an adder for adding outputs from the pair of infinite IIR filters to each other to supply a result of the addition to the output terminal of the digital filter apparatus, wherein phase characteristics of the pair of IIR filters with respect to the frequency are made substantially coincident with each other and control levels of the pair of level control means are adjusted so that an output level in a predetermined frequency range is controlled. The pair of IIR filters are each, for example, a Butterworth low pass filter (or a Butterworth high pass filter) formed of IIR filters, the degree of each of which is 4n (wherein n is a natural number), and an all pass filter formed of IIR filters, the degree of which is 2n. The inclination of the damping characteristics of the digital filter apparatus is, in this case, (24 dB/oct)×n.

Figure 7:
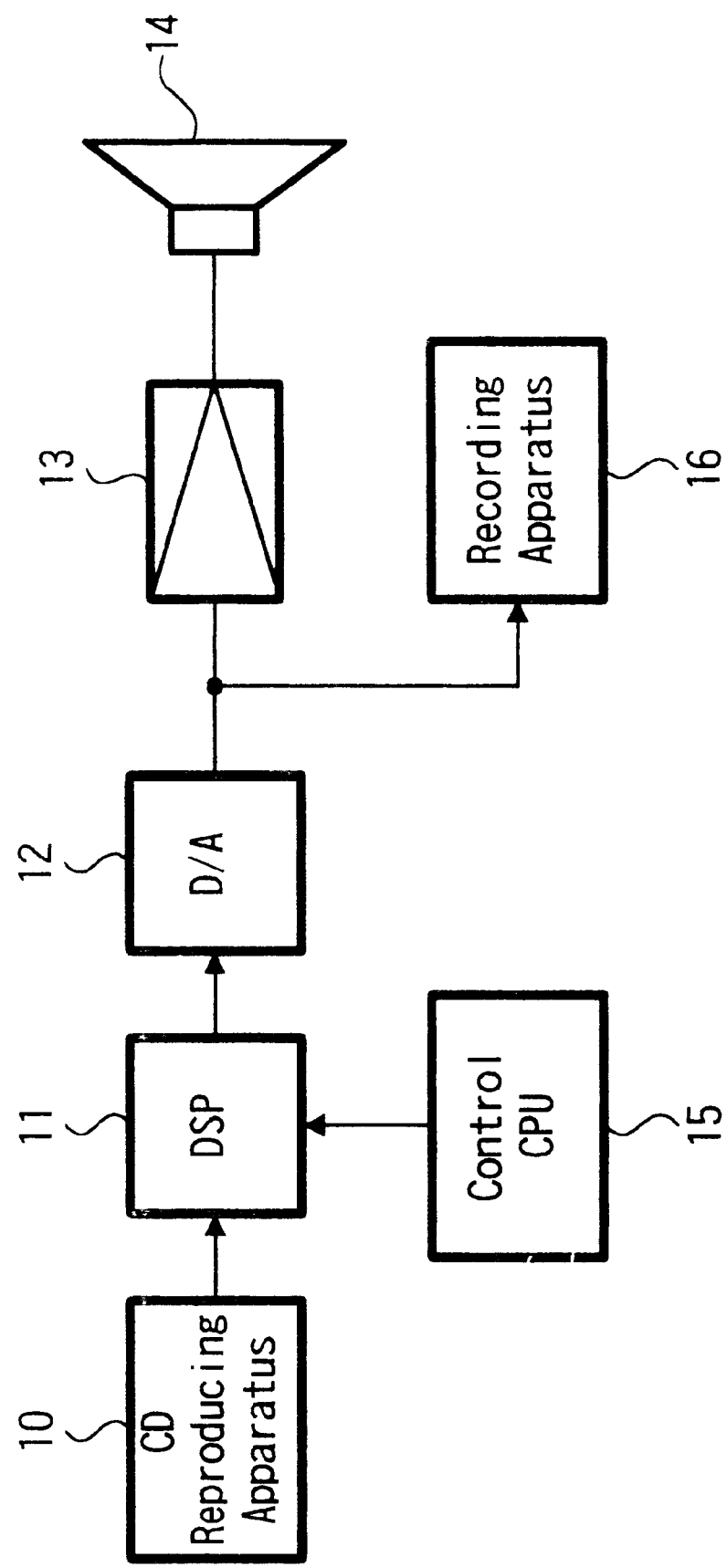
FIG. 7 is a block diagram showing a yet another embodiment of the present invention.

Referring to FIG. 7, a still another embodiment of the present invention will now be described. As shown in FIG. 4 there provided a DSP (a digital signal processor) 11 and a control CPU 15 for controlling the DSP 11. By using these components, the digital filter apparatus is formed. The DSP 11, under control of the control CPU 15, performs multiplication of the coefficient of the coefficient multiplier of the IIR filter of the digital filter apparatus, delaying of one clock period performed by the delaying unit, addition performed by the adder, level control (multiplication of a constant coefficient and multiplication of a variable coefficient) performed by the level control means 4 and 6 and addition performed by the adder 7.

Thus, a digital audio signal supplied from a CD reproducing apparatus 10 is supplied to the DSP 11. A digital audio signal output from the DSP 11 is supplied to a D/A converter 12 so as to be converted into an analog audio signal which is then supplied to a speaker unit 14 through a low-frequency amplifier 13. Moreover, the analog audio signal is supplied to a magnetic tape recording apparatus (a recording/reproducing apparatus) 16 so as to be recorded on a magnetic tape (or supplied to a magneto-optical disk recording apparatus or a recording/reproducing apparatus so as to be recorded on a magneto-optical disk).

When the analog audio signal is supplied to the DSP 11 shown in FIG. 7, the analog audio signal is supplied to an A/D converter so as to be converted into a digital audio signal, and then the digital audio signal is supplied to the DSP 11.

The signal to be supplied to the digital filter apparatus according to the present invention is not limited to the digital audio signal. A digital image signal and another digital signal may be supplied.

The predetermined frequency range, within which the output level of the digital filter apparatus is connected, is not limited to the bass and treble tones or zones. The predetermined frequency range may be a band zone.

According to the first aspect of the present invention, the digital filter apparatus is formed to comprise a pair of different type infinite impulse response digital filters connected in parallel to the input terminal of the digital filter apparatus; level control means respectively disposed in output sides of the pair of infinite impulse response digital filters; and an adder for adding outputs from the pair of level control means to each other to supply a result of the addition to an output terminal of the digital filter apparatus, wherein phase characteristics of the pair of infinite impulse response digital filters with respect to the frequencies are made substantially coincident with each other and control levels of the pair of level control means are adjusted so that an output level in a predetermined frequency range is controlled. As a result, a digital filter apparatus can be obtained with which the output level in the predetermined frequency range can arbitrarily be controlled without influence of the phase rotation of the infinite impulse response digital filter and which has steep inclination of the damping characteristic. According to the first aspect of the present invention capable of realizing the steep inclination of the damping characteristic, the influence of the frequency characteristic on the frequency range in the damping side adjacent to the predetermined frequency range can significantly be prevented.

According to the second aspect of the present invention, the digital filter apparatus according to the first aspect of the present invention has the structure such that the pair of infinite impulse response digital filters respectively are a Butterworth infinite impulse response digital low pass filter, the degree of which is 4n (wherein n is a natural number), and an infinite impulse response digital all pass filter, the degree of which is 2n. Therefore, a digital filter apparatus capable of arbitrarily controlling the bass and treble output levels can be obtained in addition to the effect of the first aspect of the present invention.

According to the third aspect of the present invention, the digital filter apparatus according to the first aspect of the present invention has the structure such that the pair of infinite impulse response digital filters respectively are a Butterworth infinite impulse response digital high pass filter, the degree of which is 4n (wherein n is a natural number), and an infinite impulse response digital all pass filter, the degree of which is 2n. Therefore, a digital filter apparatus capable of arbitrarily controlling the treble and low output levels can be obtained in addition to the effect of the first aspect of the present invention.

According to the fourth aspect of the present invention, the digital filter apparatus according to the first aspect of the present invention has the structure such that a signal supplied to the input terminal is a digital audio signals, and the digital filter apparatus has a frequency characteristic with which an output level in a medium and bass tone range (for example, about 200 Hz or lower) in a predetermined frequency range can be controlled. Therefore, any obstruction owing to load noise and engine noise in a vehicle can be suppressed when the structure according to this aspect is applied to an audio reproducing apparatus to be mounted on the vehicle. Thus, the quality of reproduced sound can be improved to correspond to the noise characteristic in the vehicle.

Having described preferred embodiments of the invention with reference to the accompanying drawings, it is to be understood that the invention is not limited to those precise embodiments and that various changes and modifications could be effected therein by one skilled in the art without departing from the spirit or scope of the novel concepts of the invention as defined in the appended claims.

What is claimed is:

1. A digital filter apparatus comprising:

a first infinite impulse response digital filter for determining pass band frequencies for an input signal;

a second infinite impulse response digital filter for passing all frequencies of said input signal in a pass band;

first level control means for controlling an output signal from said first infinite impulse response digital filter;

second level control means for controlling an output signal from said second infinite impulse response digital filter; and an adder for adding outputs from said first and second level control means and for supplying a result of the addition to an output terminal, wherein phase characteristics of said first and second infinite impulse response digital filters with respect to a frequency are made substantially coincident with each other, and control levels of said pair of level control means are adjusted so that an output level in a predetermined frequency range is controlled.

2. The digital filter apparatus according to claim 1, wherein said first infinite impulse response digital filter is a Butterworth infinite impulse response digital low pass filter.

3. The digital filter apparatus according to claim 1, wherein said first infinite impulse response digital filter is a Butterworth infinite impulse response digital high pass filter.

4. The digital filter apparatus according to claim 1, wherein said predetermined frequency range of said output level is a middle and bass tone range.

5. The digital filter apparatus according to claim 4, wherein said medium and bass tone range is equal or lower than 200 Hz.

6. The digital filter apparatus according to claim 1, wherein a degree number of the first infinite impulse response digital filter is greater than a degree number of second infinite impulse response digital filter.

* * * * *